(12) United States Patent
Komatsu et al.

(10) Patent No.: US 12,243,858 B2
(45) Date of Patent: Mar. 4, 2025

(54) ELECTRONIC COMPONENT MODULE, AND METHOD OF MANUFACTURING ELECTRONIC COMPONENT MODULE

(71) Applicant: Murata Manufacturing Co., Ltd., Nagaokakyo (JP)

(72) Inventors: Toru Komatsu, Nagaokakyo (JP); Tadashi Nomura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 172 days.

(21) Appl. No.: 18/297,110

(22) Filed: Apr. 7, 2023

(65) Prior Publication Data

US 2023/0246010 A1    Aug. 3, 2023

Related U.S. Application Data

(63) Continuation of application No. PCT/JP2021/040195, filed on Nov. 1, 2021.

(30) Foreign Application Priority Data

Nov. 10, 2020 (JP) .................. 2020-187049

(51) Int. Cl.
*H01L 25/16* (2023.01)
*H01L 23/552* (2006.01)

(52) U.S. Cl.
CPC .......... *H01L 25/162* (2013.01); *H01L 23/552* (2013.01)

(58) Field of Classification Search
CPC ............................ H01L 25/162; H01L 23/552

USPC ......................................................... 361/784
See application file for complete search history.

(56) References Cited

U.S. PATENT DOCUMENTS

| | | | |
|---|---|---|---|
| 2004/0183193 A1 | 9/2004 | Koide et al. | |
| 2013/0077262 A1 | 3/2013 | Yamamoto et al. | |
| 2014/0003004 A1* | 1/2014 | Kamakura | H05K 3/30 361/748 |
| 2014/0029216 A1* | 1/2014 | Ukita | H05K 1/181 361/752 |

FOREIGN PATENT DOCUMENTS

| | | |
|---|---|---|
| JP | 2004-288834 A | 10/2004 |
| JP | 5454681 B2 | 3/2014 |

(Continued)

OTHER PUBLICATIONS

International Search Report for PCT/JP2021/040195 dated Feb. 1, 2022.

*Primary Examiner* — Andargie M Aychillhum
(74) *Attorney, Agent, or Firm* — McDonald Hopkins LLC

(57) ABSTRACT

An electronic component module includes a substrate, a sub-module to be mounted on a main surface of the substrate, and a terminal conductor formed on a main surface of the substrate. The sub-module includes a substrate, an electronic component, an electronic component, and an electronic component. The substrate has a main surface and a main surface. The electronic component and the electronic component are mounted on the main surface. The electronic component is mounted on the main surface. The substrate has a through hole that penetrates between the main surface and the main surface. The sub-module is mounted so that the electronic component may be housed in the through hole.

17 Claims, 10 Drawing Sheets

(56) References Cited

FOREIGN PATENT DOCUMENTS

| | | |
|---|---|---|
| JP | 2014-138072 A | 7/2014 |
| WO | 2011/148915 A1 | 12/2011 |
| WO | 2012/105394 A1 | 8/2012 |
| WO | 2014/125973 A1 | 8/2014 |

\* cited by examiner

ELECTRONIC COMPONENT MODULE, AND METHOD OF MANUFACTURING ELECTRONIC COMPONENT MODULE

CROSS REFERENCE TO RELATED APPLICATION

This is a continuation of International Application No. PCT/JP2021/040195 filed on Nov. 1, 2021 which claims priority from Japanese Patent Application No. 2020-187049 filed on Nov. 10, 2020. The contents of these applications are incorporated herein by reference in their entireties.

BACKGROUND OF THE DISCLOSURE

Field of the Disclosure

The present disclosure relates to an electronic component module obtained by mounting a plurality of electronic components on a substrate.

Description of the Related Art

Patent Literature 1 discloses a module board. The module board disclosed in Patent Literature 1 includes a core board, a plurality of electronic components, and a small board. The electronic components are mounted on the small board.

The plurality of electronic components and the small board are mounted on the core board. A cavity is formed in the core board. The electronic components to be mounted on the small board is housed in the cavity.
Patent Literature 1: Japanese Patent No. 5454681

BRIEF SUMMARY OF THE DISCLOSURE

However, in such a conventional configuration disclosed in Patent Literature 1, further high-density mounting has been difficult.

Therefore, the present disclosure is to provide an electronic component module capable of high density mounting.

An electronic component module according to the present disclosure includes a main substrate, a front side sub-module to be mounted on a front surface of the main substrate, an external connection terminal conductor formed on a back surface of the main substrate, and a back side sub-module to be mounted on the back surface of the main substrate. The front side sub-module includes a first sub-substrate, a first sub-electronic component, and a second sub-electronic component. The first sub-substrate has a first sub-main surface and a second sub-main surface parallel to the first sub-main surface. The first sub-electronic component is mounted on the first sub-main surface. The second sub-electronic component is mounted on the second sub-main surface. The main substrate has a through hole that penetrates between the front surface and the back surface. The front side sub-module is mounted so that the second sub-electronic component may be housed in the through hole. The back side sub-module includes a second sub-substrate that has a third sub-main surface and a fourth sub-main surface parallel to the third sub-main surface, and a third sub-electronic component mounted on the third sub-main surface. The second sub-electronic component is an electronic component that has a heat-generating property, and the second sub-substrate has a heat transmission path at a position that overlaps with the second sub-electronic component, when viewed in a direction normal to the back surface of the main substrate.

In this configuration, the sub-module on which electronic components are double-sided mounted is mounted on the main substrate. In such a case, the electronic component on the back side of the sub-module is housed in the through hole of the main substrate. As a result, while a thickness (a height) of the module is prevented from increasing, the module on which a larger number of electronic components are mounted is formed.

According to the present disclosure, a high-density-mounted electronic component module is able to be achieved.

DETAILED DESCRIPTION OF THE DISCLOSURE

First Exemplary Embodiment

Figure 1:
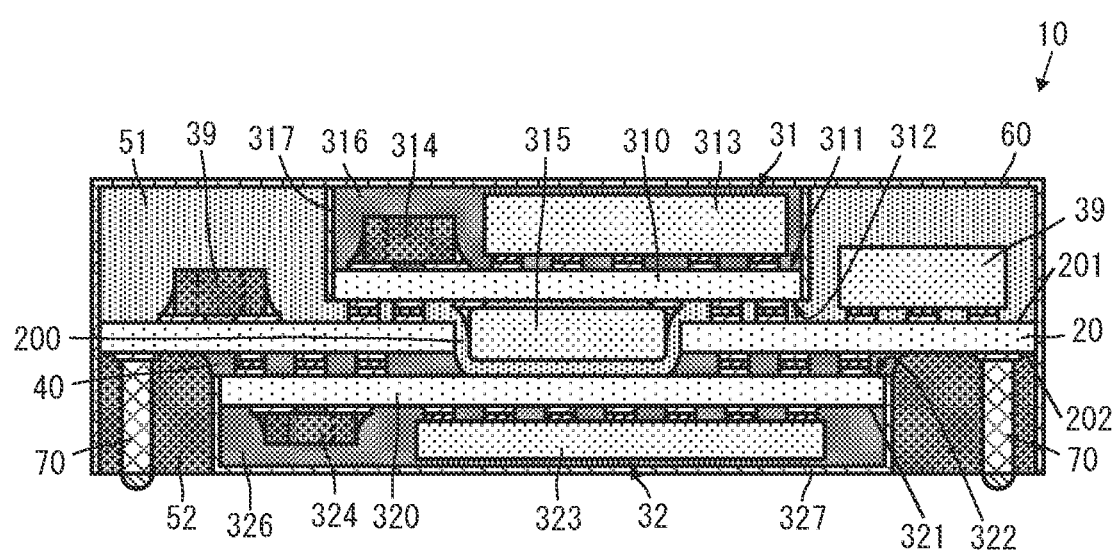
FIG. 1 is a side cross-sectional view showing a configuration of an electronic component module according to a first exemplary embodiment of the present disclosure.
Figure 2:
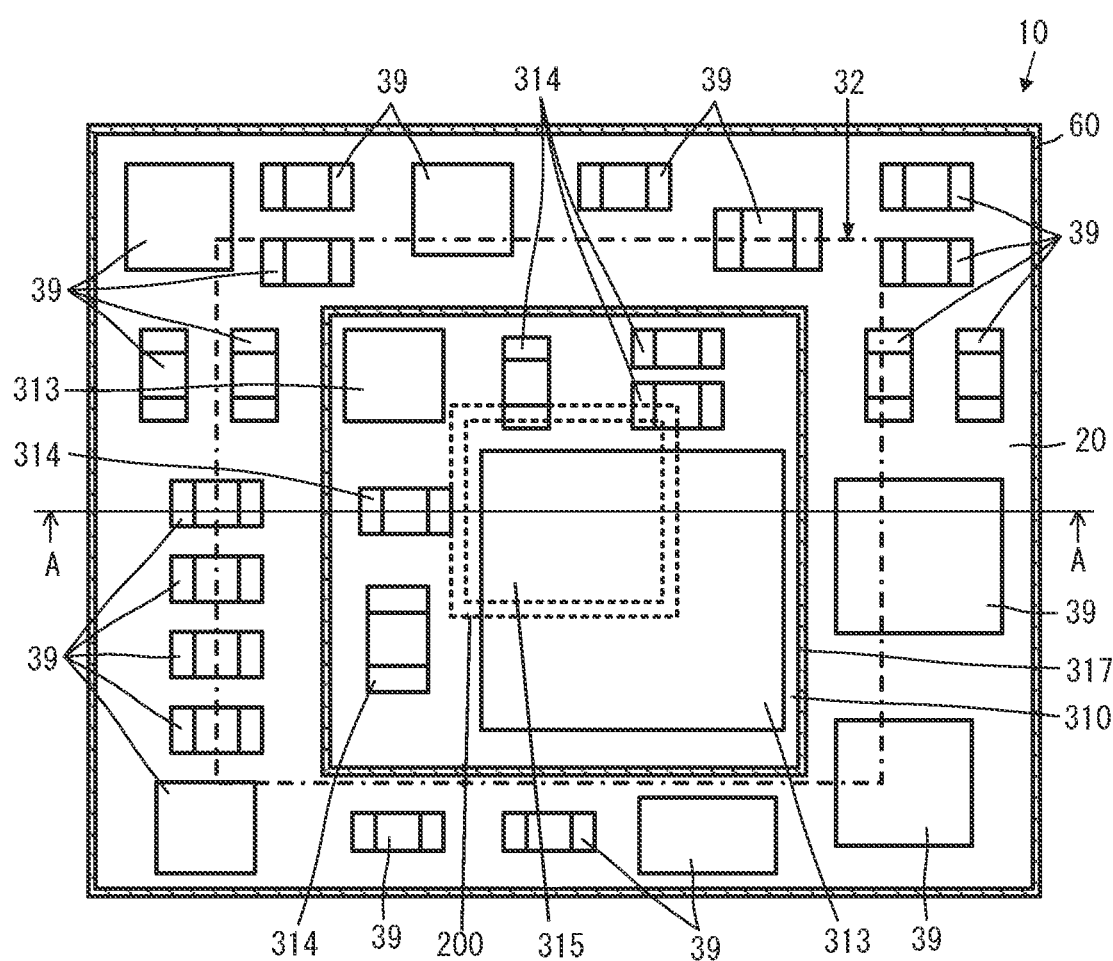
FIG. 2 is a plan view showing of the electronic component module according to the first exemplary embodiment, as viewed from a front side.
Figure 3:
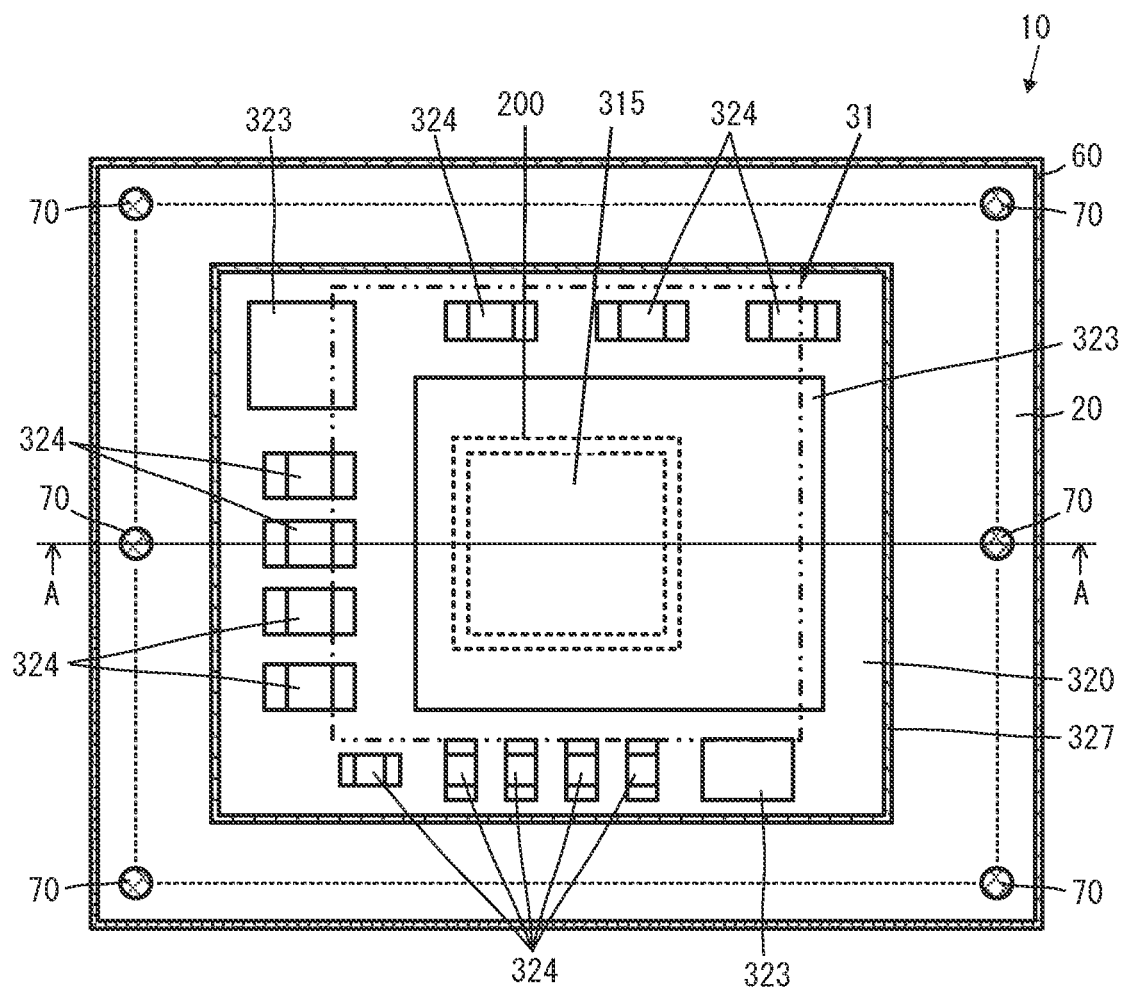
FIG. 3 is a plan view showing of the electronic component module according to the first exemplary embodiment, as viewed from a back side.

An electronic component module according to a first exemplary embodiment of the present disclosure will be described with reference to drawings. FIG. 1 is a side cross-sectional view showing a configuration of the electronic component module according to the first exemplary embodiment of the present disclosure. FIG. 2 is a plan view showing of the electronic component module according to the first exemplary embodiment, as viewed from a front side. It is to be noted that FIG. 2 is a plan view in a state in which a sealing resin and a top surface portion of a shield film are removed. FIG. 3 is a plan view showing of the electronic component module according to the first exemplary embodiment, as viewed from a back side. It is to be noted that FIG.

Figure 4A:
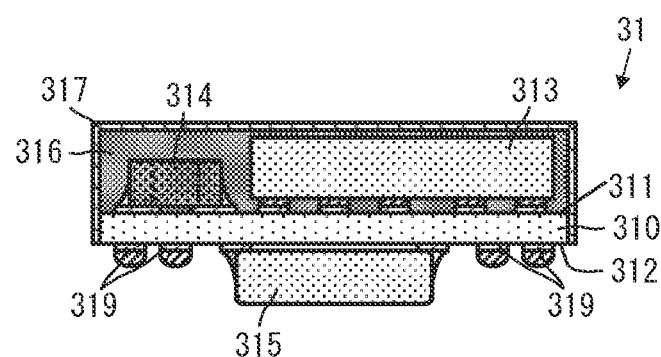
FIG. 4A and FIG. 4B are side cross-sectional views showing a configuration of a sub-module in the electronic component module according to the first exemplary embodiment.
Figure 4B:
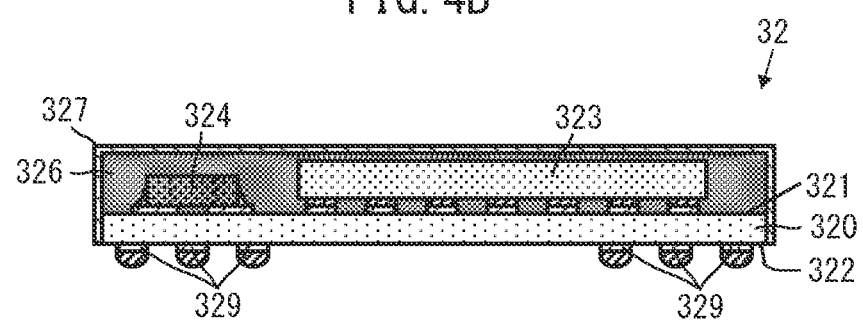

3 is a plan view in a state in which a sealing resin is removed. FIG. 4A and FIG. 4B are side cross-sectional views showing a configuration of a sub-module in the electronic component module according to the first exemplary embodiment. FIG. 1, FIG. 4A, and FIG. 4B are A cross-sectional views shown in FIG. 2 and FIG. 3. It is to be noted that FIG. 1, FIG. 2, FIG. 3, FIG. 4A, and FIG. 4B properly emphasize a size, in order to make a configuration more understandable. Such illustration is made not only in the first exemplary embodiment but also in other exemplary embodiments.

The electronic component module 10 is used as a module that process a high-frequency signal, such as a front end module of a high frequency communication signal, for example.

As shown in FIG. 1, FIG. 2, and FIG. 3, the electronic component module 10 includes a substrate 20, a sub-module 31, a sub-module 32, a plurality of electronic components 39, an underfill resin 40, a sealing resin 51, a sealing resin 52, a shield film 60, and an external connection terminal conductor 70. The sub-module 31 corresponds to the "front side sub-module" of the present disclosure, and the sub-module 32 corresponds to the "back side sub-module" of the present disclosure. It is to be noted that the sub-module does not have a functionally specific meaning, but means a module to be mounted on the main substrate (the substrate 20) of the electronic component module 10. However, a sub-module is also able to be equipped with a functional sub-function.

(Configuration of Substrate 20)

The substrate 20 has an insulating main body and includes a conductor pattern to implement the electronic component module 10. The substrate 20 is configured such that a plurality of insulator layers including a predetermined conductor pattern are stacked, for example. It is to be noted that the substrate 20 may be a single-layer substrate. The substrate 20 corresponds to the "main substrate" of the present disclosure.

The substrate 20 is a rectangular flat plate, for example, and has a main surface 201 and a main surface 202 that are parallel to each other. The main surface 201 is a flat plate surface on one end in a thickness direction of the substrate 20, and the main surface 202 is a flat plate surface on another end in the thickness direction of the substrate 20. The substrate 20 is formed of a ceramic multilayer substrate or a resin multilayer substrate. The main surface 201 corresponds to the "front surface of the main substrate" of the present disclosure, and the main surface 202 corresponds to the "back surface of the main substrate" of the present disclosure.

The substrate 20 has a through hole 200 that penetrates between the main surface 201 and the main surface 202. The through hole 200 has an approximately rectangular shape, for example, when viewed in a direction normal to the main surface 201 and the main surface 202.

The substrate 20 includes a plurality of land electrodes (not shown) on each of the main surface 201 and the main surface 202.

(Configuration of Sub-Module 31)

As shown in FIG. 4A, the sub-module 31 includes a substrate 310, an electronic component 313, an electronic component 314, an electronic component 315, a sealing resin 316, a shield film 317, and a plurality of terminal conductors 319.

The substrate 310 has an insulating main body and includes a conductor pattern to implement the sub-module 31. The substrate 310 is configured such that a plurality of insulator layers including a predetermined conductor pattern are stacked, for example. It is to be noted that the substrate 310 may be a single-layer substrate. The substrate 310 corresponds to the "first sub-substrate" of the present disclosure.

The substrate 310 is a rectangular flat plate, for example, and has a main surface 311 and a main surface 312 that are parallel to each other. The main surface 311 is a flat plate surface on one end in the thickness direction of the substrate 310, and the main surface 312 is a flat plate surface on another end in the thickness direction of the substrate 310. The substrate 310 is formed of a ceramic multilayer substrate or a resin multilayer substrate. The main surface 311 corresponds to the "first sub-main surface" of the present disclosure, and the main surface 312 corresponds to the "second sub-main surface" of the present disclosure.

The electronic component 313 includes an insulating main body and a plurality of terminal conductors formed on the bottom surface of the main body. The electronic component 313 is an electronic component of a so-called LGA (Land Grid Array) type. It is to be noted that the electronic component 313 may be an electronic component of a BGA (Ball Grid Array) type. The electronic component 314 includes an insulating main body and a plurality of terminal conductors formed on both end surfaces of the main body. The electronic component 313 and the electronic component 314 each correspond to the "first sub-electronic component" of the present disclosure. The electronic component 313 and the electronic component 314 are mounted on the main surface 311 of the substrate 310.

The electronic component 315 includes an insulating main body and a plurality of terminal conductors formed to include a bottom surface side of the main body. The electronic component 315 corresponds to the "second sub-electronic component" of the present disclosure. The electronic component 315 is mounted on the main surface 312 of the substrate 310.

The plurality of terminal conductors 319 are mounted on the main surface 312 of the substrate 310. More specifically, when viewed in the direction normal to the main surface 312, the plurality of terminal conductors 319 are formed so as to surround the electronic component 315.

The sealing resin 316 has an insulating property and covers a side of the main surface 311 of the substrate 310. At this time, the sealing resin 316 covers the electronic component 314 and the electronic component 313. It is to be noted that, as shown in an exemplary embodiment to be described below, a top surface of the main body of the electronic component 313 does not need to be covered with the sealing resin 316. The sealing resin 316 corresponds to a "first sealing resin" of the present disclosure.

The shield film 317 has conductivity and covers an outer surface of the sealing resin 316 and a side surface of the substrate 310. The shield film 317 corresponds to a "first sub-shield film" of the present disclosure.

(Configuration of Sub-Module 32)

As shown in FIG. 4B, the sub-module 32 includes a substrate 320, an electronic component 323, an electronic component 324, a sealing resin 326, a shield film 327, and a plurality of terminal conductors 329.

The substrate 320 has an insulating main body and includes a conductor pattern to implement the sub-module 32. The substrate 320 is configured such that a plurality of insulator layers including a predetermined conductor pattern are stacked, for example. It is to be noted that the substrate 320 may be a single-layer substrate. The substrate 320 corresponds to the "second sub-substrate" of the present disclosure.

The substrate 320 is a rectangular flat plate, for example, and has a main surface 321 and a main surface 322 that are parallel to each other. The main surface 321 is a flat plate surface on one end in the thickness direction of the substrate 320, and the main surface 322 is a flat plate surface on another end in the thickness direction of the substrate 320. The substrate 320 is formed of a ceramic multilayer substrate or a resin multilayer substrate. The main surface 321 corresponds to the "third sub-main surface" of the present disclosure, and the main surface 322 corresponds to the "fourth sub-main surface" of the present disclosure.

The electronic component 323 includes an insulating main body and a plurality of terminal conductors formed on the bottom surface of the main body. The electronic component 323 is an electronic component of a so-called LGA (Land Grid Array) type. It is to be noted that the electronic component 323 may be an electronic component of a BGA (Ball Grid Array) type. The electronic component 324 includes an insulating main body and a plurality of terminal conductors formed on both end surfaces of the main body. The electronic component 323 and the electronic component 324 each correspond to the "third sub-electronic component" of the present disclosure. The electronic component 323 and the electronic component 324 are mounted on the main surface 321 of the substrate 320.

The plurality of terminal conductors 329 are mounted on the main surface 322 of the substrate 320.

The sealing resin 326 has an insulating property and covers a side of the main surface 321 of the substrate 320. At this time, the sealing resin 326 covers the electronic component 324 and the electronic component 323. It is to be noted that, as shown in an exemplary embodiment to be described below, a top surface of the main body of the electronic component 323 does not need to be covered with the sealing resin 326. The sealing resin 326 corresponds to a "second sealing resin" of the presentdisclosure.

The shield film 327 has conductivity and covers an outer surface of the sealing resin 326 and a side surface of the substrate 320. The shield film 327 corresponds to a "second sub-shield film" of the present disclosure.

(Placement, Mounting Mode of Each Component of Electronic Component Module 10)

The sub-module 31 and the plurality of electronic components 39 are mounted on a plurality of land electrodes on a side of the main surface 201. In such a case, the sub-module 31 includes a terminal conductor (not shown), and the terminal conductor is mounted on the plurality of land electrodes of the main surface 201 of the substrate 20 by a conductive bonding material such as solder.

The sub-module 31 is placed at the center of the main surface 201. More specifically, the sub-module 31 is mounted so as to overlap with the through hole 200, when viewed in the direction normal to the main surface 201. The electronic component 315 of the sub-module 31 is housed in the through hole 200.

The sub-module 32 and a plurality of terminal conductors 70 are mounted on a plurality of land electrodes on a side of the main surface 202. At this time, in the sub-module 32, the terminal conductor 329 is mounted on the plurality of land electrodes (not shown) of the main surface 202 of the substrate 20, by a conductive bonding material such as solder.

The sub-module 32 is mounted at the center of the main surface 202. More specifically, the sub-module 32 is mounted so as to overlap with the through hole 200 and the sub-module 31, when viewed in the direction normal to the main surface 201 and the main surface 202.

The plurality of terminal conductors 70 are columnar conductors, and are mounted so as to surround the sub-module 32, when viewed in the direction normal to the main surface 202.

The plurality of terminal conductors 39 are mounted so as to surround the sub-module 31, when viewed in the direction normal to the main surface 201.

The underfill resin 40 has an insulating property. The underfill resin 40 has a shape to surround the through hole 200, when viewed in the direction normal to the main surface 201 and the main surface 202. The underfill resin 40 contacts the main surface 202 of the substrate 20, and the main surface 322 of the substrate 320 in the sub-module 32. As a result, a space outside the sub-module 32 on the side of the main surface 202 of the substrate 20 and a space of the through hole 200 are separated by the underfill resin 40.

The sealing resin 51 has an insulating property and covers the side of the main surface 201 of the substrate 20. At this time, the sealing resin 51 covers the side surface and the bottom surface of the sub-module 31, and the plurality of electronic components 39. Further, the sealing resin 51 fills the through hole 200 and a region inside the underfill resin 40.

The sealing resin 52 has an insulating property and covers the side of the main surface 202 of the substrate 20. At this time, the sealing resin 52 covers the side surface and the bottom surface of the sub-module 32, and a side surface of the plurality of terminal conductors 70.

The shield film 60 has conductivity and covers an outer surface (a side surface and a top surface) of the sealing resin 51, a top surface of the sub-module 31, a side surface of the substrate 20, and a side surface of the sealing resin 52. The shield film 60 corresponds to a "main shield film" of the present disclosure.

With such a configuration, the sub-module 31 on which the plurality of electronic components 313, 314, and 315 are double-sided mounted, and the sub-module 32 on which the plurality of electronic components 323 and 324 are mounted, are double-sided mounted to the substrate 20. Further, the plurality of electronic components 39 that are different from the sub-module 31 and the sub-module 32 are mounted on the substrate 20. As a result, the electronic component module 10 is able to achieve high-density mounting.

In addition, when viewed in the direction normal to the main surface 201 and the main surface 202 of the substrate 20, the sub-module 31 and the sub-module 32 overlap with each other. As a result, the electronic component module 10 is able to achieve further high-density mounting without increasing a plane area.

Moreover, the electronic component 315 of the sub-module 31 is housed in the through hole 200 of the substrate 20. Accordingly, the electronic component module 10 is able to achieve further high-density mounting, while significantly reducing a height (achieving a reduction in height).

A component that is not able to be reduced in height by grinding or the like after mounting is suitable for the electronic component 315. A component of which a functional portion such as an LC filter is distributed throughout the entire component body, a component in which a reduction in component function such as a reduction in heat dissipation occurs by partial grinding of a component body such as a power amplifier, a surface acoustic wave filter, or a bulk acoustic wave filter, is suitable for the electronic component 315.

In addition, the sub-module 31, the sub-module 32, and the plurality of electronic components 39 are covered with the sealing resins 51 and 52. As a result, the electronic component module 10 is able to achieve high reliability. Further, the electronic component 315 is placed in the through hole 200 caught by the substrate 310 of the sub-module 31 and the substrate 320 of the sub-module 32, and this through hole 200 is also filled up with the sealing resin 51. As a result, the electronic component module 10 is able to achieve further high reliability.

In addition, the electronic component module 10, except for a surface to be mounted on an external circuit board or the like, is covered with the shield film 60. As a result, the electronic component module 10 is able to significantly reduce electromagnetic interference to an outside.

Moreover, a conductor pattern is formed on the substrate 20, the substrate 310 of the sub-module 31, and the substrate 320 of the sub-module 31. More specifically, a ground conductor pattern is formed on the main surface 312 of the substrate 310 and the main surface 322 of the substrate 320, for example. It is to be noted that the ground conductor pattern may be formed on an inner layer near the main surface 312 of the substrate 310 and an inner layer near the main surface 322 of the substrate 320.

According to the configuration, the electronic component 315 is placed between the conductor pattern (not shown) formed on the substrate 310 of the sub-module 31 and the conductor pattern (not shown) formed on the substrate 320 of the sub-module 31. More specifically, the electronic component 315 is placed between the ground conductor pattern (not shown) formed on the main surface 312 of the substrate 310 and the ground conductor pattern (not shown) formed on the main surface 322 of the substrate 320, for example. Further, in a plan view, the electronic component 315 are surrounded by the shield film 317 of the sub-module 31 and the shield film 327 of the sub-module 32. As a result, the electromagnetic interference between the electronic components 39 except for the sub-module 31 and the sub-module 32 and the electronic component 315 is able to be significantly reduced. Furthermore, the shield film 60 of the electronic component module 10 further significantly reduces the electromagnetic interference between an electronic component outside the electronic component module 10 and the electronic component 315.

Then, each of the above components is appropriately combined, so that the electronic component module 10 is able to achieve high-density mounting, a reduction in size, and high reliability.

It is to be noted that, in the above configuration, in a case in which a thickness (a height) of the electronic component 315 is larger than a thickness of the substrate 20, the electronic component 315 is preferably placed so as to penetrate the through hole 200 and protrude from the main surface 202. As a result, a height near the main surface 201 of the substrate 20 is able to be further reduced.

(Method of Manufacturing Electronic Component Module)

Figure 5:
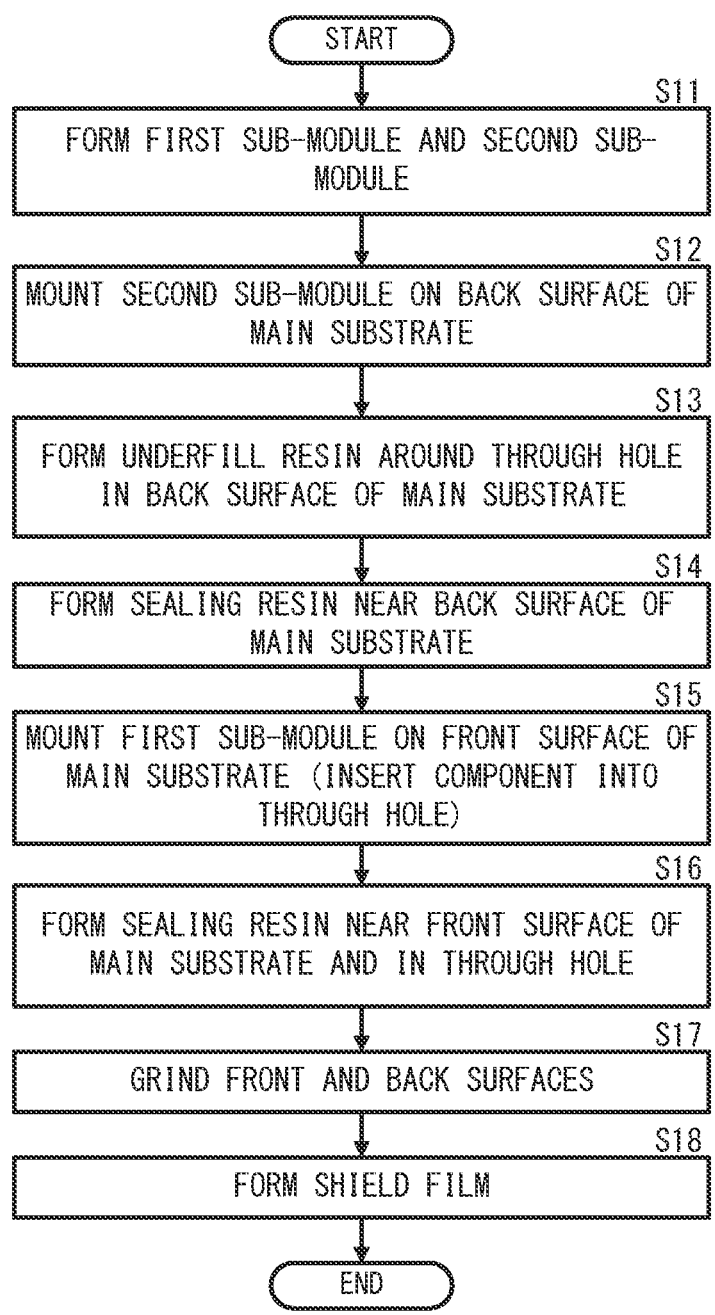
FIG. 5 is a flow chart showing a method of manufacturing the electronic component module according to the first exemplary embodiment.

The electronic component module 10 configured as described above is able to be manufactured by the following method, for example. FIG. 5 is a flow chart showing a method of manufacturing the electronic component module according to the first exemplary embodiment. FIG. 6A, FIG. 6B, FIG. 6C, FIG. 7A, FIG. 7B, and FIG. 7C are side cross-sectional views showing a state of each manufacturing step of the electronic component module according to the first exemplary embodiment. In the detailed content in each manufacturing step, a specific description of a portion described in the description of the above configuration will be omitted.

A first sub-module (the sub-module 31) and a second sub-module (the sub-module 32) are formed (S11).

Figure 6A:
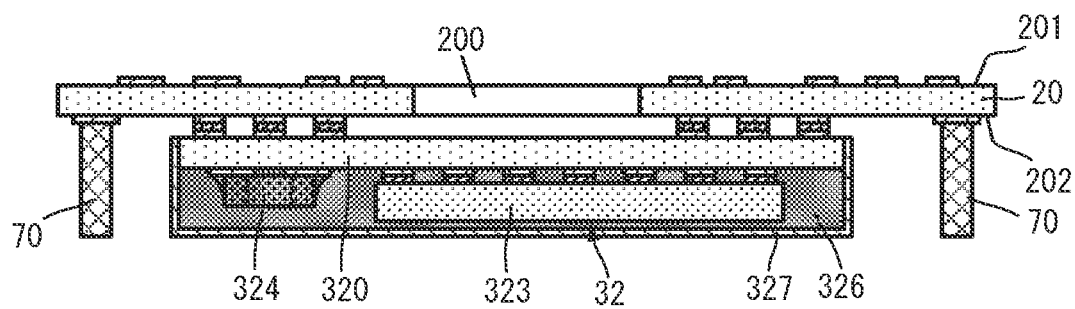
FIG. 6A, FIG. 6B, and FIG. 6C are side cross-sectional views showing a state of each manufacturing step of the electronic component module according to the first exemplary embodiment.

As shown in FIG. 6A, the second sub-module (the sub-module 32) is mounted on the back surface (the main surface 202) of the main substrate (the substrate 20) (S12). At this time, the plurality of terminal conductors 70 are also mounted on the back surface (the main surface 202) of the main substrate (the substrate 20). It is to be noted that the plurality of terminal conductors 70 may be previously formed on the main substrate (the substrate 20) by plating or the like.

Figure 6B:
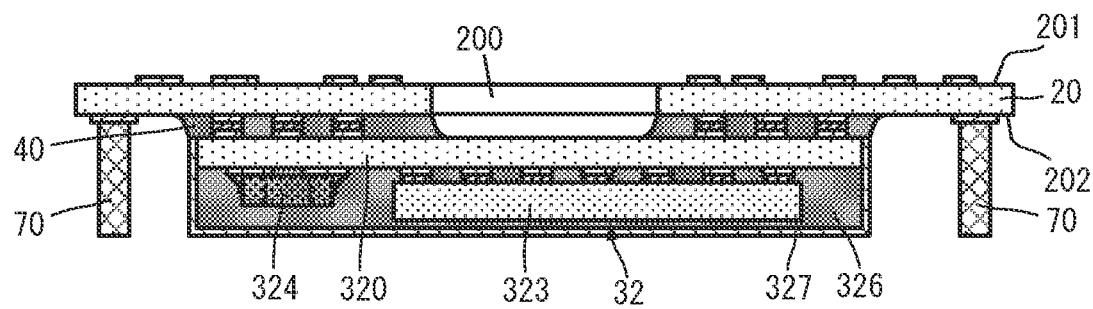

As shown in FIG. 6B, the underfill resin 40 is formed so as to surround the through hole 200 in the back surface (the main surface 202) of the main substrate (the substrate 20) (S13).

Figure 6C:
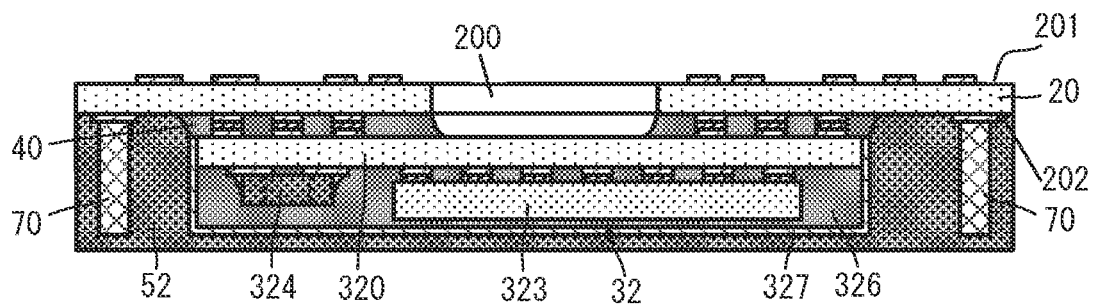

As shown in FIG. 6C, the sealing resin 52 is formed near the back surface (the main surface 202) of the main substrate (the substrate 20) (S14). At this time, the presence of the underfill resin 40, even when the sealing resin 52 is applied, prevents the sealing resin 52 from flowing into the through hole 200.

Figure 7A:
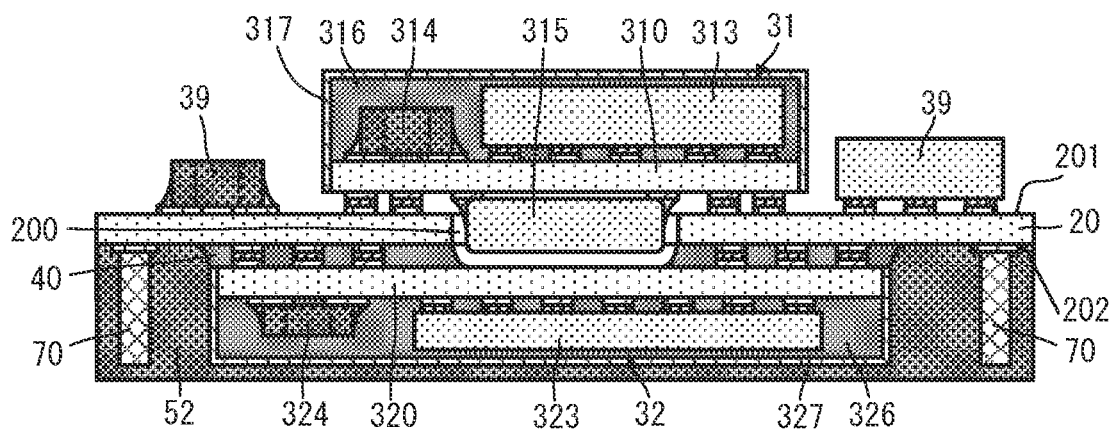
FIG. 7A, FIG. 7B, and FIG. 7C are side cross-sectional views showing a state of each manufacturing step of the electronic component module according to the first exemplary embodiment.

As shown in FIG. 7A, the first sub-module (the sub-module 31) is mounted on the front surface (the main surface 202) of the main substrate (the substrate 20) (S15). At this time, the electronic component (the electronic component 315) near the back surface (the main surface 312) of the first sub-module (the sub-module 31) is inserted and housed in the through hole 200.

Figure 7B:
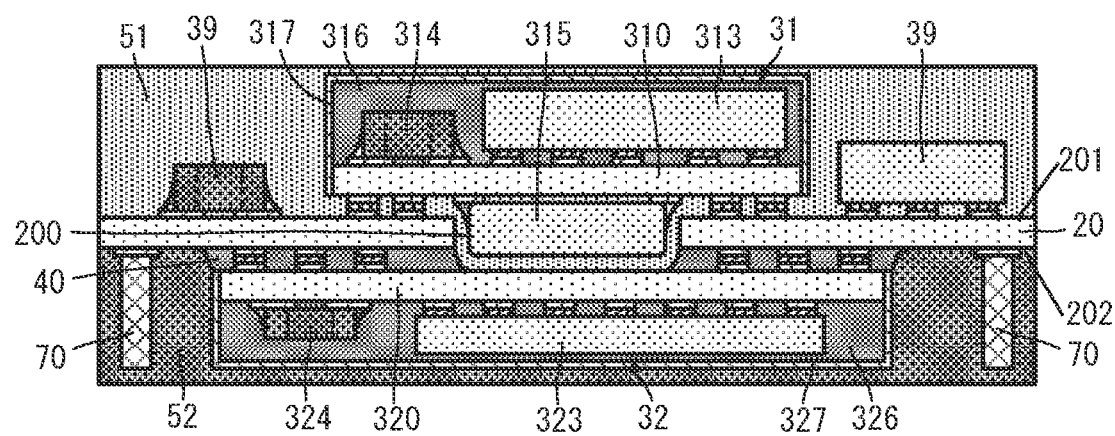

As shown in FIG. 7B, the sealing resin 51 is formed near the front surface (the main surface 201) of the main substrate (the substrate 20) and in the through hole 200 (S16).

Figure 7C:
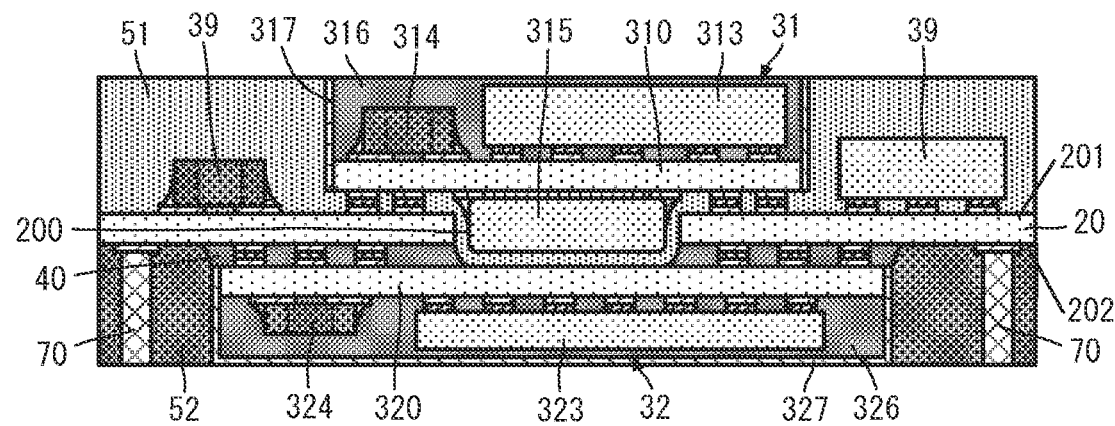

As shown in FIG. 7C, the surface (the top surface) of the sealing resin 51 and the surface (the bottom surface) of the sealing resin 52 are ground to a predetermined depth (S17).

The shield film 60 is formed on the top surface and the side surface of the sealing resin 51, the side surface of the substrate 20, and the side surface of the sealing resin 52 (S18).

By use of such a manufacturing method, the electronic component module 10 is able to be easily and more reliably manufactured.

It is to be noted that the above manufacturing method, up to Step S17, is executed in a multi-substrate state in which a plurality of structures are arrayed to achieve each of a plurality of electronic component modules 10. Then, cutting into individual pieces and forming the shield film 60 are performed after Step S17 to manufacture the plurality of electronic component modules 10.

In addition, in the above manufacturing method, the manufacturing method in which the second sub-module (the sub-module 32) on a back side of the main substrate is first mounted is shown. However, the first sub-module (the sub-module 31) on a front side of the main substrate is also able to be mounted first. In such a case, the underfill resin 40 may be formed between the surface (the main surface 201) of the main substrate (the substrate 20), and the first sub-module (the sub-module 31). Then, the through hole 200 is filled up with the sealing resin 52 in this case.

Second Exemplary Embodiment

Figure 8:
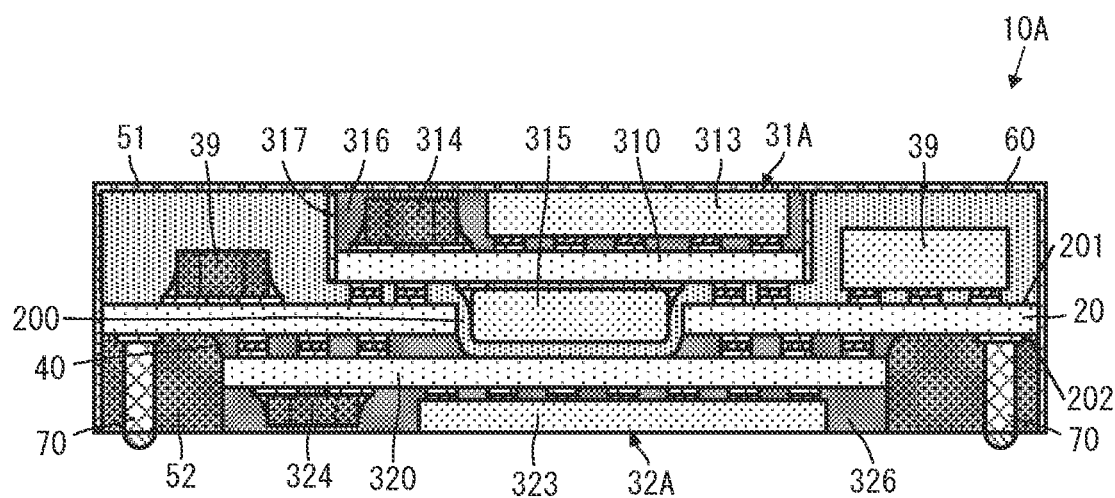
FIG. 8 is a side cross-sectional view showing a configuration of an electronic component module according to a second exemplary embodiment.

FIG. 8 is a side cross-sectional view showing a configuration of an electronic component module according to a second exemplary embodiment. As shown in FIG. 8, the electronic component module 10A according to the second exemplary embodiment is different from the electronic component module 10 according to the first exemplary embodiment in that a sub-module 31A and a sub-module 32A are provided. Other configurations of the electronic component module 10A are the same as or similar to the configurations of the electronic component module 10, and a description of the same or similar configuration will be omitted.

The electronic component module 10A includes the sub-module 31A and the sub-module 32A. The sub-module 31A is obtained by grinding the sub-module 31 according to the first exemplary embodiment from a top side and reducing the height. The sub-module 32A is obtained by removing the shield film from the sub-module 32 according to the first exemplary embodiment, grinding from the top side of the sub-module 32, and reducing the height. In grinding the sub-module 31 and the sub-module 32 to reduce the height, the electronic component 313 and the electronic component 323 may also be partially ground. In order that a part of the component is ground, the electronic component 313 and the electronic component 323 are desirably components of which functional portions are unevenly distributed on the side on which the terminal conductors are formed. For example, such components are semiconductor components, surface acoustic wave filters, bulk acoustic wave filters, or the like.

With such a configuration, the electronic component module 10A is able to obtain the same effects and advantages as the effects and advantages of the electronic component module 10. Further, the electronic component module 10A is able to achieve a further reduction in height.

Third Exemplary Embodiment

Figure 9:
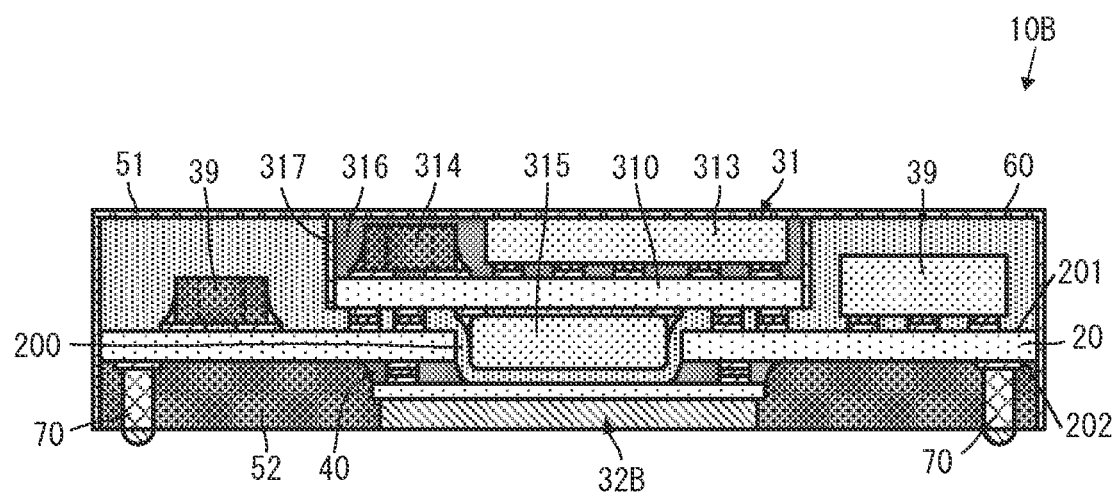
FIG. 9 is a side cross-sectional view showing a configuration of an electronic component module according to a third exemplary embodiment.

FIG. 9 is a side cross-sectional view showing a configuration of an electronic component module according to a third exemplary embodiment. As shown in FIG. 9, the electronic component module 10B according to the third exemplary embodiment is different from the electronic component module 10 according to the first exemplary embodiment in that a sub-module 32B is provided. Other configurations of the electronic component module 10B are the same as or similar to the configurations of the electronic component module 10, and a description of the same or similar configuration will be omitted.

The electronic component module 10B includes the sub-module 32B. The sub-module 32B has a Fanout structure (a fan-out structure). The sub-module 32B is ground from the top side and is reduced in height. It is to be noted that the Fanout structure (the fan-out structure) is called FOWLP (Fan Out Wafer Level Package), and means a structure in which an area of a package is larger than an area of a semiconductor chip built into the package and an external connection terminal is extended (fanned out) to the outside of the semiconductor chip by a substrate or the like in the package. As a result, for example, a terminal pitch of the external connection terminal is able to be larger than a terminal pitch of the semiconductor chip, which makes the mounting to the substrate 20 easy and reliable.

With such a configuration, the electronic component module 10B is able to obtain the same effects and advantages as the effects and advantages of the electronic component module 10. Further, the electronic component module 10B is able to achieve a further reduction in height.

Fourth Exemplary Embodiment

Figure 10:
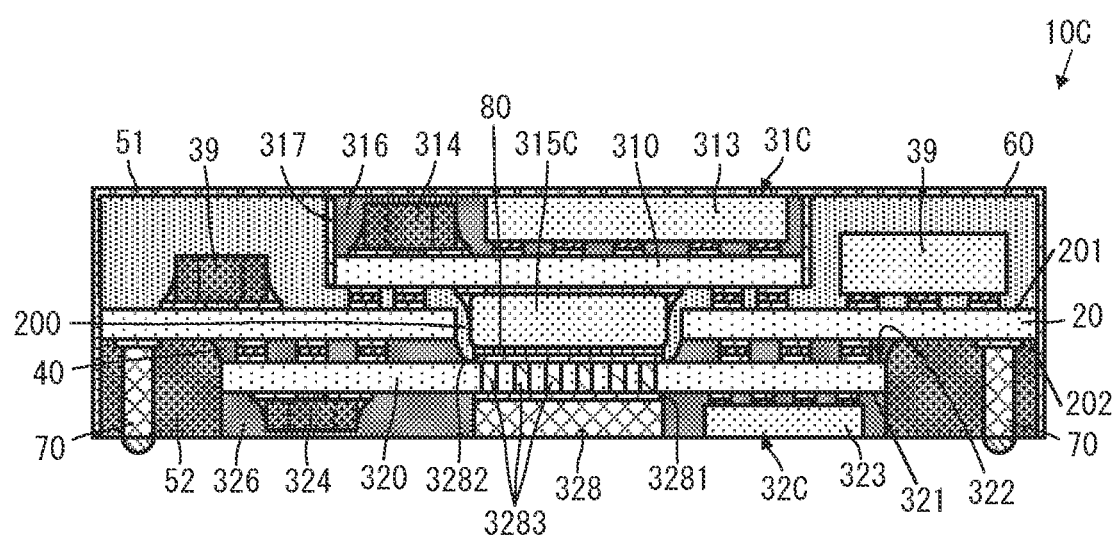
FIG. 10 is a side cross-sectional view showing a configuration of an electronic component module according to a fourth exemplary embodiment.

FIG. 10 is a side cross-sectional view showing a configuration of an electronic component module according to a fourth exemplary embodiment. As shown in FIG. 10, the electronic component module 10C according to the fourth exemplary embodiment is different from the electronic component module 10A according to the second exemplary embodiment in that a sub-module 31C and a sub-module 32C are provided.

The sub-module 31C is different from the sub-module 31 according to the second exemplary embodiment in that an electronic component 315C is provided. Other configurations of the sub-module 31C are the same as or similar to the configurations of the sub-module 31, and a description of the same or similar configuration will be omitted.

The electronic component 315C is an electronic component that has a heat-generating property, and is a power amplifier, a surface acoustic wave filter, or a bulk acoustic wave filter, or the like, for example.

The sub-module 32C is different from the sub-module 31C according to the second exemplary embodiment in that a heat dissipation component 328, a planar conductor pattern 3281, a planar conductor pattern 3282, and a plurality of via conductors 3283 are provided.

The planar conductor pattern 3281 is formed on the main surface 321 of the substrate 20. The planar conductor pattern 3281 has a rectangular shape or the like, when viewed in the direction normal to the main surface 321 of the substrate 320, for example, and has a predetermined area. The area of the planar conductor pattern 3281 may be larger than or equal to a shape of the top surface of the electronic component 315C in a plan view. The planar conductor pattern 3281 corresponds to a "first planar conductor pattern" of the present disclosure.

The planar conductor pattern 3282 is formed on the main surface 322 of the substrate 20. The planar conductor pattern 3282 has a rectangular shape or the like, for example, when viewed in the direction normal to the main surface 322 of the substrate 320, and has a predetermined area. The area of the planar conductor pattern 3282 may be larger than or equal to a shape of the top surface of the electronic component 315C in a plan view. For example, the planar conductor pattern 3282 may be the same in shape as the planar conductor pattern 3281. The planar conductor pattern 3282 corresponds to a "second planar conductor pattern" of the present disclosure.

The planar conductor pattern 3282 and the planar conductor pattern 3281, when viewed in the direction normal to the substrate 320, overlap with each other.

The plurality of via conductors 3283 penetrate the substrate 320. The plurality of via conductors 3283 overlap with the planar conductor pattern 3281 and the planar conductor pattern 3282, and connect to the planar conductor pattern 3281 and the planar conductor pattern 3282.

The heat dissipation component 328 is rectangular parallelepiped shaped, and has a high thermal conductivity. The heat dissipation component 328 is a copper chip, for example. The heat dissipation component 328 is mounted on the planar conductor pattern 3281. A top surface of the heat dissipation component 328 is not covered with the sealing resin 326, but is exposed to the outside. The top surface of the heat dissipation component 328 is a surface opposite to a surface to be mounted on the planar conductor pattern 3281.

The sub-module 32C is mounted on the substrate 20 so that the planar conductor pattern 3281 and the planar conductor pattern 3282 may overlap with the electronic component 315C, when viewed in the direction normal to the substrate 20.

The planar conductor pattern 3282 and the top surface of the electronic component 315C are placed across the thermally conductive film 80. The planar conductor pattern 3282 and the top surface of the electronic component 315C come into contact with the thermally conductive film 80.

With such a configuration, the electronic component module 10C is able to obtain the same effects and advantages as the effects and advantages of the electronic component module 10.

Moreover, in the electronic component module 10C, the heat generated by the electronic component 315C is dissipated to the outside of the electronic component module 10C through a heat transmission path to be configured by the thermally conductive film 80, the planar conductor pattern 3282, the plurality of via conductors 3283, the planar conductor pattern 3281, and the heat dissipation component 328. As a result, heat dissipation of the electronic component 315C is able to be improved, and reliability of the electronic component module 10C improves. In addition, in this configuration, for example, the heat dissipation component 328 is brought into contact with a planar conductor such as a ground conductor of another circuit board. As a result, the heat of the electronic component 315C is propagated to the planar conductor of the other circuit board, which is able to obtain a higher heat dissipation effect.

It is to be noted that the configuration of each of the above exemplary embodiments is able to be appropriately combined, and advantageous functions and effects according to each combination are able to be obtained.

10, 10A, 10B, 10C: electronic component module
20, 310, 320: substrate
31, 31A, 31C, 32, 32A, 32B, 32C: sub module
39, 313, 314, 315, 315C, 323, 324: electronic component
40: underfill resin
51, 52, 316, 326: sealing resin
60, 317, 327: shield film
70, 319, 329: terminal conductor
80: thermally conductive film
200: through hole
201, 202, 311, 312, 321, 322: main surface
328: heat dissipation component
3281, 3282: planar conductor pattern
3283: via conductor

The invention claimed is:

1. An electronic component module comprising: a main substrate; a front side sub-module to be mounted on a front surface of the main substrate; an external connection terminal conductor provided on a back surface of the main substrate; and a back side sub-module to be mounted on the back surface of the main substrate, wherein: the front side sub-module includes: a first sub-substrate having: a first sub-main surface; and a second sub-main surface parallel to the first sub-main surface; a first sub-electronic component mounted on the first sub-main surface; and a second sub-electronic component mounted on the second sub-main surface; the main substrate has a through hole penetrating between the front surface and the back surface; the front side sub-module is mounted so that the second sub-electronic component is housed in the through hole; the back side sub-module includes: a second sub-substrate having: a third sub-main surface; and a fourth sub-main surface parallel to the third sub-main surface; and a third sub-electronic component mounted on the third sub-main surface; the second sub-electronic component is an electronic component having a heat-generating property; and the second sub-substrate has a heat transmission path, at a position overlapping with the second sub-electronic component, when viewed in a direction normal to the back surface of the main substrate, wherein, when viewed in the direction normal to the front surface and the back surface of the main substrate, the back side sub-module overlaps with the front side sub-module.

2. The electronic component module according to claim 1, further comprising:
a first sealing resin covering a front side of the main substrate; and
a second sealing resin covering a back side of the main substrate.

3. The electronic component module according to claim 2, further comprising an underfill resin having a shape to surround the through hole, when viewed in the direction normal to the front surface of the main substrate, and being shaped to contact the back side sub-module and the back surface of the main substrate or shaped to contact the front side sub-module and the front surface of the main substrate,
wherein the through hole is filled up with the first sealing resin or the second sealing resin.

4. The electronic component module according to claim 3, wherein the back side sub-module has a fan-out structure.

5. The electronic component module according to claim 3, further comprising a second sub-shield film covering a side surface of the back side sub-module.

6. The electronic component module according to claim 2, wherein the back side sub-module has a fan-out structure.

7. The electronic component module according to claim 2, further comprising a second sub-shield film covering a side surface of the back side sub-module.

8. The electronic component module according to claim 1, wherein the back side sub-module has a fan-out structure.

9. The electronic component module according to claim 8, further comprising a second sub-shield film covering a side surface of the back side sub-module.

10. The electronic component module according to claim 1, wherein the heat transmission path includes:
a first planar conductor pattern provided on the third sub-main surface;
a second planar conductor pattern provided on the fourth sub-main surface;
a plurality of via conductors penetrating between the third sub-main surface and the fourth sub-main surface, and connecting to the first planar conductor pattern and the second planar conductor pattern; and
a heat dissipation component mounted on the first planar conductor pattern and exposed to an outside.

11. The electronic component module according to claim 10, further comprising a thermally conductive film placed between the second sub-electronic component and the second planar conductor pattern, and connecting to the second sub-electronic component and the second planar conductor pattern.

12. The electronic component module according to claim 1, further comprising a second sub-shield film covering a side surface of the back side sub-module.

13. The electronic component module according to claim 1, further comprising a first sub-shield film covering a side of the front side sub-module facing the first sub-main surface and a lateral surface of the front side sub-module.

14. The electronic component module according to claim 1, further comprising a main shield film covering a front side and a lateral side of the main substrate in the main substrate.

15. The electronic component module according to claim 1, further comprising:
a first sealing resin covering a front side of the main substrate; and
a second sealing resin covering a back side of the main substrate.

16. The electronic component module according to claim 1, wherein the back side sub-module has a fan-out structure.

17. The electronic component module according to claim 1, further comprising a second sub-shield film covering a side surface of the back side sub-module.

* * * * *